United States Patent
Du et al.

(10) Patent No.: US 7,181,708 B1
(45) Date of Patent: Feb. 20, 2007

(54) COVERAGE METRIC AND COVERAGE COMPUTATION FOR VERIFICATION BASED ON DESIGN PARTITIONS

(75) Inventors: Xiaoqun Du, New Providence, NJ (US); Robert P. Kurshan, New York, NY (US); Kavita Ravi, Chatham, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 144 days.

(21) Appl. No.: 10/916,258

(22) Filed: Aug. 10, 2004

(51) Int. Cl.
*G06F 17/50* (2006.01)
(52) U.S. Cl. ...................................................... 716/5
(58) Field of Classification Search ............... 716/5
See application file for complete search history.

(56) References Cited

U.S. PATENT DOCUMENTS

| | | | |
|---|---|---|---|
| 6,523,151 B2* | 2/2003 | Hekmatpour | 716/4 |
| 6,704,912 B2* | 3/2004 | Narain et al. | 716/4 |
| 6,708,143 B1* | 3/2004 | Kurshan | 703/2 |
| 2002/0002698 A1* | 1/2002 | Hekmatpour | 716/4 |
| 2003/0121011 A1* | 6/2003 | Carter | 716/4 |
| 2004/0006751 A1* | 1/2004 | Kawabe et al. | 716/4 |
| 2004/0117746 A1* | 6/2004 | Narain et al. | 716/4 |
| 2004/0199887 A1* | 10/2004 | Jain et al. | 716/5 |
| 2004/0225974 A1* | 11/2004 | Johnson | 716/4 |

* cited by examiner

*Primary Examiner*—Stacy A Whitmore
(74) *Attorney, Agent, or Firm*—Bingham McCutchen LLP (57) ABSTRACT

A method of electronic circuit design includes performing property verification for partitions of a design of an electronic circuit, selecting an outcome for each partition from a plurality of outcome categories, and computing coverage information for each element of the design based on the outcome.

42 Claims, 6 Drawing Sheets

COVERAGE METRIC AND COVERAGE COMPUTATION FOR VERIFICATION BASED ON DESIGN PARTITIONS

COPYRIGHT NOTICE

A portion of the disclosure of this patent document contains material which is subject to copyright protection. The copyright owner has no objection to the facsimile reproduction by anyone of the patent document or patent disclosure, as it appears in the U.S. Patent and Trademark Office patent file or records, but otherwise reserves all copyrights whatsoever.

FIELD OF THE INVENTION

The present invention is related to verification of integrated circuit designs. More particularly, the present invention is directed to a method and system for verifying integrated circuit designs through partitioning.

BACKGROUND

Circuit designers and verification engineers use different methods to verify circuit designs. One common verification technique is simulation. Simulation dynamically verifies a design by monitoring behaviors of the design with respect to simulation test benches. Another verification technique is model checking. Model checking statically verifies properties of a design by analyzing the state space of the design and determining whether a property holds in all reachable states. The properties to verify may be global properties involving signals in widely separated parts of the design, or they may be more local properties that pertain only to single or small number of related modules in the design.

There are two distinct classes of local properties: built-in and user-specified. The built-in properties are those that can be inferred from the structure of the design, for example, the absence of arithmetic overflow, range overflow, index overflow, bus contention, multi-driven bus, divide by zero, and combinational cycles. The user-specified properties are those that are explicitly provided by the user, for example, as synthesis programs or as assertions defined in an assertion language.

Model checking has potential advantages over simulation. For example, no simulation test bench is required to run model checking. Moreover, model checking, unlike simulation, is exhaustive. On the other hand, model checking, due to computational limitations, generally cannot handle large designs.

Hence, designs should be partitioned into sufficiently small parts in order to model check a given property. Although presently capacity is not an issue for simulation of designs, it is foreseeable that in the future designs could be of a size that cannot be handled by a simulator as a whole. The partitioning may be used in design verification if the design variables in the partitions could be covered.

To determine if the variables are covered during design verification, a number of different traditional coverage metrics may be performed. However, the traditional methods cannot be used to determine coverage of variables in a design that is partitioned because they are not based on multiple categories of outcomes of property verifications. The traditional coverage metrics are only designed for simulation runs on the entire design, and not for verification of multiple partitions of a large design.

SUMMARY OF THE INVENTION

A coverage metric is based on multiple categories of outcomes of property verification. A coverage computation method which uses the coverage metric is used when performing verification based on partitions of a large design.

DETAILED DESCRIPTION

A coverage metric that considers multiple categories of verification is presented. The metric can be used for computing coverage during a verification process. For example, when performing an assertion-based verification method, the verification can have one of several different outcomes: an assertion can be verified or falsified; the verification may be incomplete (did not finish, or DNF); or an assertion may not be checked due to lack of time (did not start, or DNS). This information is useful, because it can be used to indicate a function to be performed on a particular part of the design.

For example, portions of the circuit that result in DNS or DNF during the verification process may be considered as not covered. With the coverage metric that is based on multiple categories of outcomes, the verification process can consider this information to efficiently allocate resources when verifying the uncovered assertions (i.e., verifying assertions marked DNS over those marked DNF). With the information provided by the coverage metric, portions of the circuit that have failed the verification can then be fixed and re-run.

In one embodiment, a coverage metric that considers multiple verification outcomes in the presence of design partitions classifies each design variable based on one of the several possible verification outcomes. For example, the metric can classify each variable into one of four categories: a variable is classified by the metric as covered if it is in a partition that is verified; otherwise, it is classified as blocked if it is in a partition for which an error has been discovered; otherwise, it is classified as DNF if the verification did not finish with in the given time limit for a partition that the variable is in; or otherwise it is classified as DNS if no partitions containing the variable are subjected to verification. Notice that in this classification, there is a precedence relationship among the coverage categories. "Covered" has the highest precedence, followed by "blocked", then by "DNF", and "DNS" has the lowest precedence.

In the context of design partitions, a design verification process is performed using this coverage metric to compute coverage information. The process can take into account overlap among partitions, uniquification (removal of isomorphic partitions), and exclusion of selected module instances in the design partitions. For example, the process may use hash tables to record partitions, to record sharing among partitions, and to record partitions that contain an alteration to the design hierarchy sub-tree. Furthermore, the verification method may also address re-partitioning (partitioning an existing partition further) and re-verification (verification of partitions that result from re-partitioning) to verify those design partitions that were classified as DNF by the coverage metric.

Figure 1:
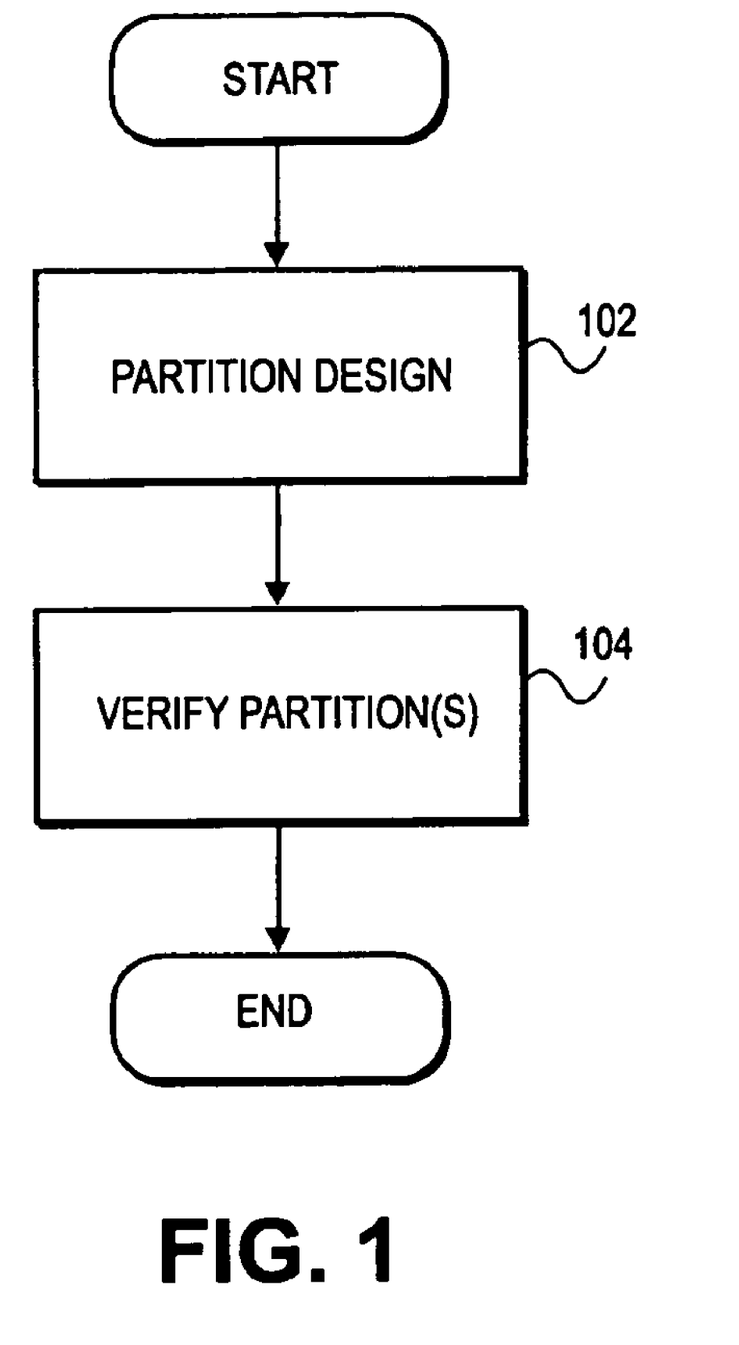
FIG. 1 depicts a high-level process flow chart for verifying an integrated circuit design.

To perform partition based verification, a design may be divided into pieces, or partitions. FIG. 1 depicts a high-level flow chart for verifying an integrated circuit design according to an embodiment of the invention. The design is divided into one or more partitions, 102. A partition is defined by taking a subset of the design and carving out the rest of the design by creating pseudo inputs for input ports in the partition. After the design has been partitioned, each partition is verified, 104. In an embodiment, the method computes state variable coverage for the partitioned design during verification. (Coverage of any other set of interesting variables, such as combinational variables, can also be performed.)

Figure 2:
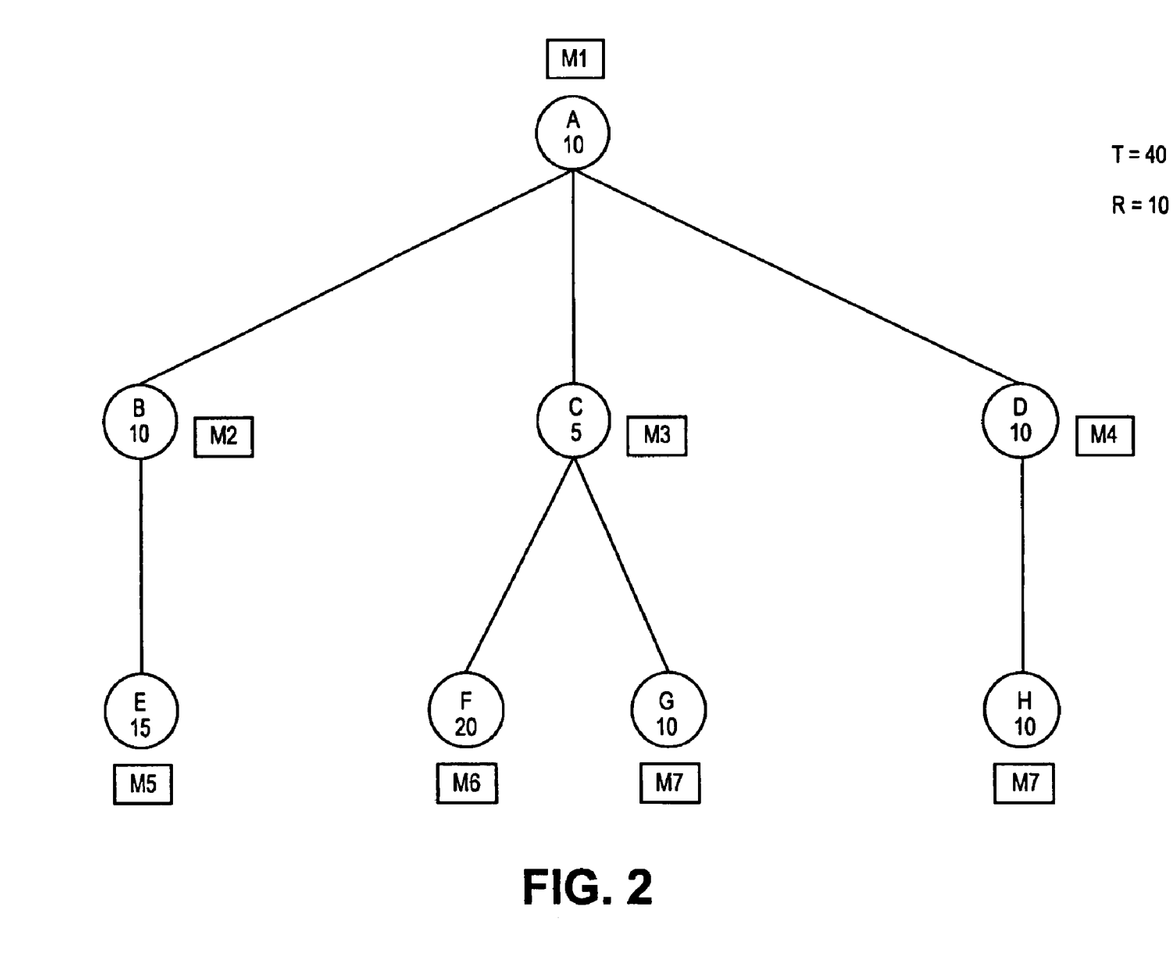
FIG. 2 illustrates an example of a design hierarchy tree that is partitioned and verified, and for which coverage information may be computed.

Examples of partitions that can have coverage information computed by the process of FIG. 1 are shown in FIG. 2. Given a design variable in a table of disjoint partitions, it is regarded as in the partition P if it is directly declared in P. For example, referring to FIG. 2, partitions for an exemplary design hierarchy tree 300 with seven modules, M1–M7, and eight module instances, A–H, are illustrated. As used herein, the term "module" refers to any part of an integrated circuit design. A module may comprise, for example, one or more functional components or a part of each of one or more functional components. A module is generally parameterized and thus may be instantiated one or more times in an integrated circuit design to describe "instances" of that module. An integrated circuit design in this case is comprised of module instances.

In this example, the local weight of each instance has been calculated and a partition threshold has been specified. In one embodiment, the design is partitioned such that as much coherence as possible is preserved, i.e., each partition is a contiguous portion of the tree defined by a root. For example, three partitions {A,D,H}, {B,E}, and {C,F,G} can be defined. Instances A, B, and C are the roots of the three partitions. In another embodiment, the design is partitioned such that there are no significant disparities between each partition's weight. For example, instead of the partitions weighing 40, 35, and 30, the design can be partitioned into {A,B,E}, {C,F,G}, and {D,H}, weighing 35, 35, and 30, respectively. In an alternative embodiment, no module instance is defined in more than one partition. For example, since instances G and H are instantiated from the same module M7, only one of the instances need to be included in a partition.

An embodiment of a method of computing coverage for the module instances shown in FIG. 2 during verification may be performed as follows:

For every entry of the partition table
  If the partition is covered (or blocked, DNF, DNS, respectively)
    add partition weight to covered bits (or blocked, DNF, DNS, respectively)
  End The coverage computation process can take isomorphic partitions into account. Two or more partitions which contain instances of the same module or modules, and are structurally equivalent, are called isomorphic partitions. Isomorphic partitions in the design are uniquified, so that only one of them is subject to verification, in order to avoid redundant verification work of instances of the same module. A uniquification process regards a design variable as in a partition P if it is declared in a partition Q that is isomorphic to partition P. The uniquified partition Q may then be ignored by the verification tool to avoid redundant verification work.

A data structure for performing uniquification may be used, where the data structure is a partition table. In one embodiment, a partition table is represented as a hash table, and each entry of the table represents one or more isomorphic partitions. The partition may be defined to be a list of module instances it contains. The key to the hash table is the module of which the root node of the partition is an instance, together with the list of relative paths of its child nodes in the partition. This allows multiple isomorphic partitions to be stored in the same entry of the hash table. To make sure the coverage is correct, the repeat count, i.e., the number of isomorphic partitions that an entry of the partition table represents (not counting isomorphic partitions rooted at altered nodes), is stored in a table entry.

Figure 3:
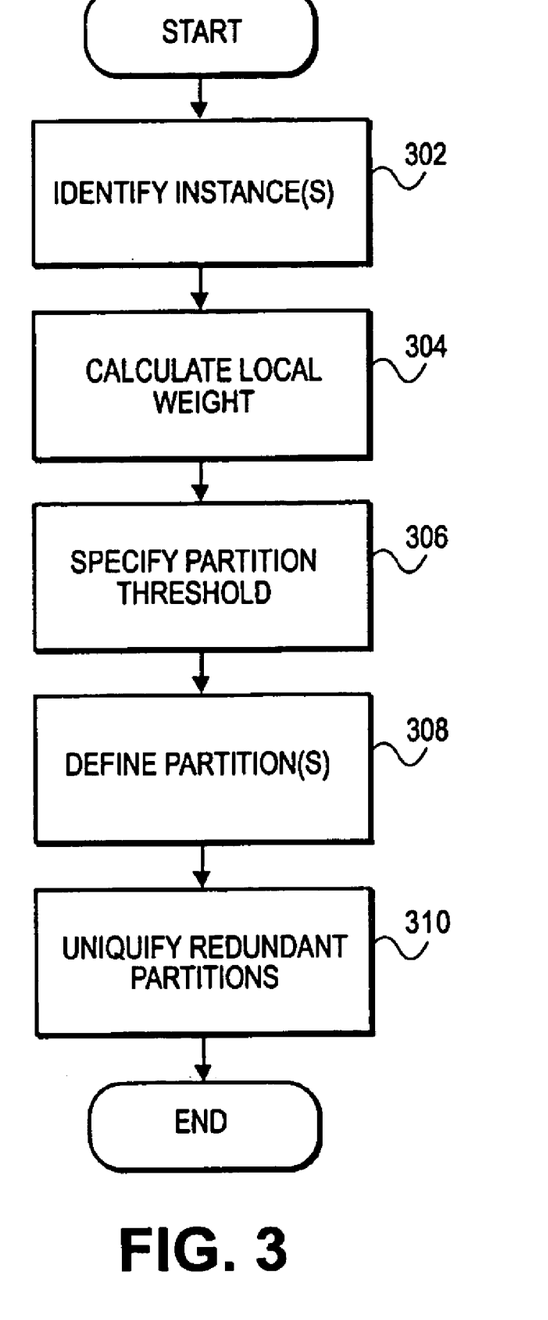
FIG. 3 illustrates a method of partitioning an integrated circuit design.

FIG. 3 illustrates a method of computing coverage using uniquification. One or more module instances of the design are identified, 302. A local weight for each module instance is calculated, 304. A weight can be any syntactic measure that reflects the cost of verifying a design in terms of time and memory. The weight may be a function of sequential and combinational elements in the design. Synthesis rules may be used to ascertain the number of sequential and combinational variables in the design. A partition weight threshold is specified, 306, to limit the size of each partition. The partition threshold is specified in the same unit of measure as the weight and should be of a size that can be verified in an efficient manner.

The partitions are defined, 308, so that the combined weight of the modules of each defined partition is less than or equal to the threshold weight. If the local weight of an individual module instance is greater than the partition threshold, the partition is defined to be that single module. Redundant partitions are uniquified, 310, so that they may be avoided. In one embodiment, redundant partitions are uniquified and avoided by not considering a portion of the design hierarchy tree, i.e., a sub-tree, when the root of the sub-tree is instantiated from the same module instance as the root of a previously defined partition, and that the design hierarchy sub-tree rooted at both root nodes have not been altered.

Another consideration of the coverage method is overlapping partitions. This occurs when the partitions are not disjoint, but rather, a part of one partition overlaps a portion of another. Overlap of partitions is essential in preserving connectivity among design modules within partitions and minimizing the total number of partitions. The overlap among design partitions is factored into coverage computation so as not to count the same design element more than once.

To handle overlap of partitions, a shared node table is introduced in addition to the partition table for nodes that are shared by different partitions. The coverage of the shared nodes are computed from the shared node table, rather than from the partition table. This ensures that the nodes that appear in multiple partitions are not over-counted. During the partitioning process, in order to balance the need to minimize redundancy and the need to preserve connectivity among design modules, it is desirable to allow only the root nodes of partitions to be shared by multiple partitions. In this case, the shared node table becomes a shared root table, which contains only nodes that are partition roots.

In one embodiment, the shared node table structure is a hash table that stores the modules of nodes that are shared among multiple partitions. (Notice this is not module instances, thus different instances of the same module may be represented by the same entry in the shared node table). The fields of this structure include module name, local weight, repeat count, and coverage mark. A node may be marked as shared and entered into the shared node table due to bin-packing, a method which splits a design sub-tree into multiple partitions that share the root node.

The computation method may also consider designs whose hierarchy tree have been altered. A design hierarchy tree may be altered by removing one or more of its sub-trees. Such alterations, which are called instance-level freeing, are used to ignore some parts of the design during verification. The removal of a design hierarchy sub-tree corresponds to freeing certain module instances from the design hierarchy. For example, when some parts of the design are designated as outside the scope of the verification effort, the designated design parts are separated, or freed, from the design hierarchy tree, so the designated parts are not subjected to verification or coverage computation.

When design partitions cover a partial design hierarchy tree via instance-level freeing, the design hierarchy sub-trees rooted in the modules/nodes that have some descendents freed are no longer isomorphic to the sub-trees rooted at other nodes of the same module. The nodes having an altered sub-tree are called altered nodes. To compute coverage for partitions rooted at altered nodes, a data structure called the altered root list is introduced for each partition table entry. Each member of this list is a node whose sub-tree is altered by instance-level-free, and the node is also the root of a partition. Furthermore, the partition rooted at this node has uniquified with (that is, isomorphic to) the current partition table entry.

To simplify the coverage computation, when a partition rooted at an altered node uniquifies with another partition, the repeat count of the other partition is not incremented. Rather, the coverage for the partition with the altered node is computed from the altered root list, described above. Each partition with an altered node as root will appear in the partition table or in some altered root list only once, which corresponds to a repeat count of exactly one for each partition with an altered root node.

Partitions that are rooted at altered nodes may also share nodes with each other. The coverage of these shared nodes are computed from another table, called altered node table. This table is analogous to the shared node table. When only root nodes are allowed to be shared among partitions, the altered node table becomes an altered root table. Since each partition with an altered root node can have a repeat count of exactly one, the coverage computation for the altered root nodes can be simplified by using the altered root table, regardless of whether the altered root node is a shared or not. This way it is no longer necessary to record whether an altered root node is shared or not. The Fields of an entry in the altered root table include pathname of the module instance, local weight, and coverage mark.

The shared root table and the altered root table may be global tables. Shared root tables or altered root tables local to only one partitioning run, either during the initial partitioning, or during the repartitioning of a partition, is not needed. By not using such local tables, the process avoids merging the shared or altered root table local to a partitioning run into the current global shared or altered root table which holds results for the previous partitions/rounds. When only the global shared root table and altered root table are used, these tables can be directly updated any time a new partition is examined. In particular, it is easiest if the global tables are updated in a routine separate from the partitioning process, after the verification is completed, or after a repartitioning round.

Repartitioning of selected design partitions may be performed during verification. Repartitioning, which is further partitioning of a design partition, is considered if the classification of the partition is DNF after a verification attempt. The same set of global partition, shared root, and altered root tables is used to register new partition entries and the associated shared or altered nodes.

With repartitioning, the verification may be conducted in rounds. For example, when all the partitions have been subjected to verification, the verification method revisits DNF partitions in a new round for repartitioning and verification. A repartitioning round is labeled by an integer, which is the identifier of the round. Each partition has a round id field, which indicates the round id when this partition is first created (Notice repartitioning may produce an equivalent partition later, which gets uniquified away).

Figure 4:
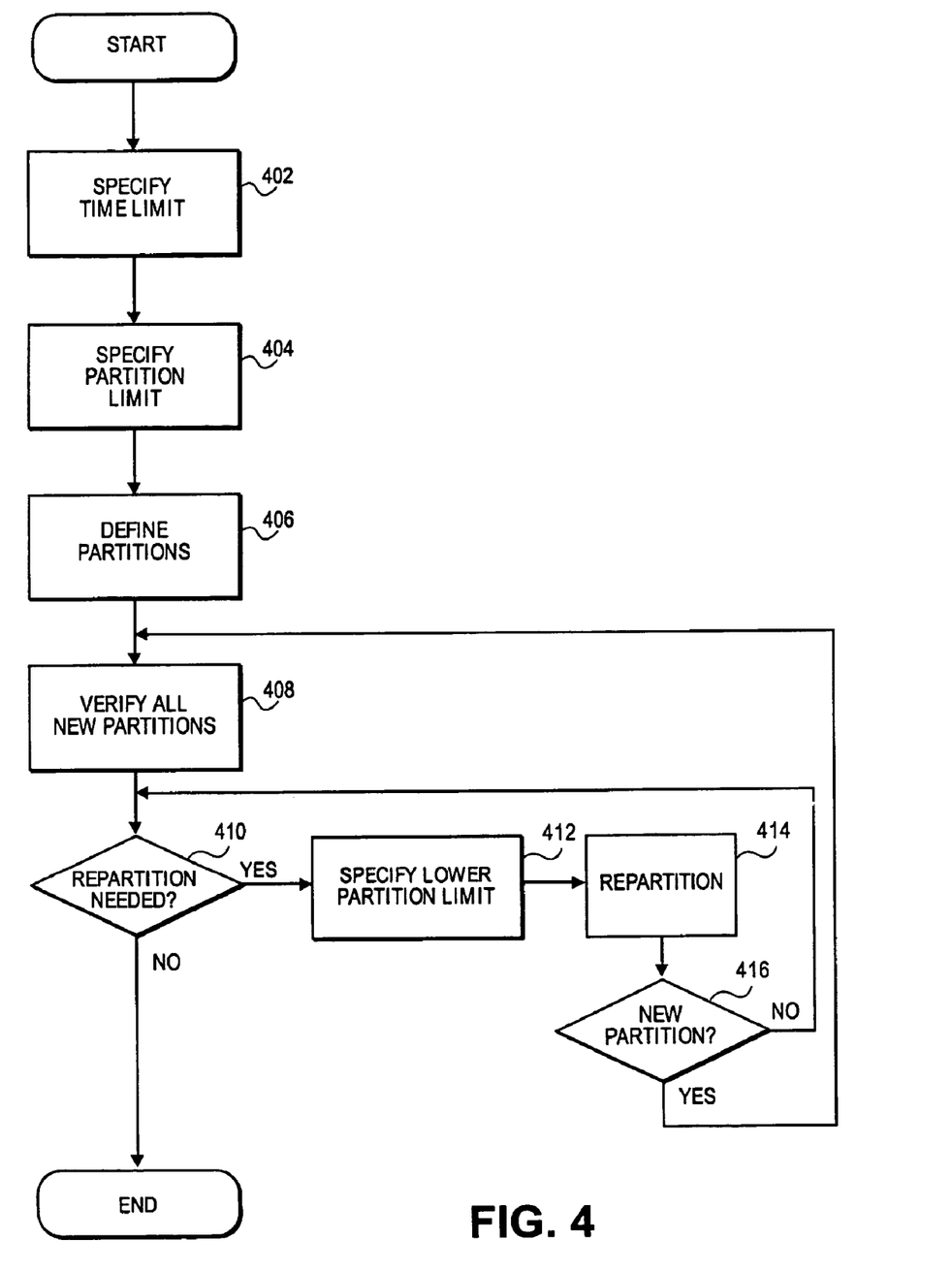
FIG. 4 illustrates an embodiment of the verification of a design using partitions, during which coverage information may be computed.

FIG. 4 illustrates an embodiment of computing coverage with uniquification, overlap among partitions, instance-level freeing, and repartitioning, when verifying the partitions. A time limit for verifying each partition is specified, 402. A partition limit is also specified, 404. The partitions are defined, 406. A partition table, a shared root table, and an altered root table are also generated. Verification of a partition 408 is performed and will be terminated if it is not finished within the specified time limit. During verification 408, the partitions in the partition table are verified, and coverage information is computed.

If the verification of all partitions is complete, the process ends. If verification is not completed, DNF partitions may be repartitioned into smaller pieces, 410. In one embodiment, the repartitioning lowers the partition threshold, 412. In another embodiment, the partition threshold is halved each time a partition is repartitioned. After repartitioning, the process at 416 then returns to 408 to verify the new partitions, or to 410 if there are no new partitions. The coverage method may be performed at the various stages of partitioning, repartitioning, and verification of the design.

When a new partition is defined, it is added to the partition table if it is not isomorphic to an existing partition in the partition table. Two partitions are isomorphic, or equal, if the roots of the partition are instantiated from the same module, and if there are one or more children, the children of the two partitions are instantiated from the same modules and are connected to the root in the same way. For repartitioning 414, a newly created partition may be inserted into a partition table in two places: One is as a part of the partitioning process, where the new partition may be inserted into the local partition table of the initial partitioning method 406. Another is as a part of merging of the local partition table into the global partition table. In this example, the shared root table and altered root table may be updated when a partition is being merged into the global table after repartitioning 414. The tables may also be updated by making a pass of the partition tables during verification 408.

In general, design partitions can be derived based on any criteria a designer selects. One approach of deriving design partitions is described in U.S. application Ser. No. 10/422, 535 filed Apr. 23, 2003 entitled Method and System for Verifying Integrated Circuit Designs Through Partitioning, and is incorporated herein by reference.

The coverage metric may combine and extend coverage metrics of toggle coverage and finite-state machine based coverage. Toggle coverage determines whether a binary variable toggles, i.e. assumes both its values, 0 or 1, during the verification. Coverage based on finite-state machines deter mines how many different states or transitions are reached. The system used to verify the design affects the efficiency of the verification. For example, the COSPAN (Coordination Specification Analysis) engine, which is a well established verification system developed at Bell Laboratories in the mid-1980s, can very quickly deal with partitions with 40–50 sequential variables.

Another example of a method to compute coverage for verification based on design partitions is shown in the pseudo code listed below. The pseudo code assumes that the partitions are generated by a partitioning method as discussed above, although the coverage method and coverage data structures can be applied to design partitions generated by other methods as well. The example pseudo code describes the method for various stages of the partitioning, repartitioning and verification of the design partitions. In this example, the pseudo code refers to rounds of partitioning and verification. The initial round has round id 1; The partition method is called once in this round on the entire design hierarchy tree to produce the initial global partition table. Later rounds are referred to as repartitioning rounds, where in one round, each DNF partition is repartitioned by calling the partition method.

Descriptions of exemplary data fields of a partition table entry that can be used in one embodiment of the method for coverage computation, are shown as follows:

a. repeatCount: number of times partition is repeated (not counting isomorphic partitions rooted at altered nodes)
b. alteredRootList: a list containing root paths of those partitions that uniquified with the current partition entry and are rooted at nodes whose sub-tree is altered by instance level frees (i.e. rooted at nodes who are ancestors of nodes that are instance-level freed). Since the repeat count of each such "altered root partition" is 1, this list serves as the repeat count of these altered root partitions.
c. rootIsShared: true when the root of this partition is shared with other partitions (due to inheritance from parent partition during repartitioning, or binpacking, a method which splits a design sub-tree into multiple partitions that share the root node)
d. rootIsAltered: true if the root's sub-tree is altered by instance-level frees.
e. round: partitioning and repartitioning are conducted in rounds and are numbered sequentially. This field indicates the round id when this partition is first created.
f. partRootLocalWt: used for coverage computation can be obtained from SharedRootTable also.
g. covMark: mark for coverage. This is a enumeration type, with values ranging over {CDNS, CDNF, blocked, covered}. A partition is "CDNS" if verification was not run for this partition (Did Not Start). A partition is "CDNF" if verification did not finish. A partition is blocked if verification returns false (i.e. falsified). A partition is covered if verification returns true(i.e. verified). A partition has no effect on coverage if it is repartitioned.

An example of pseudo code for performing coverage computation is given below, with reference to elements of the functions shown in FIG. 4 and to the exemplary data fields discussed above. The procedure below refers to various data structures and fields discussed above, for example: the altered node table (alteredNodeTbl); the partition being repartitioned, if the creation of the partition occurs during repartitioning (rpe); the round id; the weight of the root of the partition (part RootLocalWt); the full path name of the module instance of the root of the partition (part RootPath); and whether new partition entry shares its root with other partitions (shared). An example of pseudo code for computing coverage-related information when new partitions are is listed below.

```
/* First, initialize member fields of a partition when it is created. */
if partRootPath in alteredNodeTb1
    rootIsAltered = true;
    else rootIsAltered = false;
rootIsShared = false;
if shared and rootIsAltered == false
    set rootIsShared to true
    /* if rootIsAltered is true, then rootIsShared is don't care */
if (round > 1 && rpe.partRootPath == partRootPath of current partition)
    / *during repartition*/
    if (rpe.rootIsShared == true)
        rootIsShared = true
set round id and partRootLocalWt.
Initialize alteredRootList to empty.
repeatCount = 1;
if (round > 1)
    /* when current rootIsAltered ==true, rpe's repeat count is 1*/
    repeatCount = rpe.repeatCount;
set covMark to CDNS.
/* Second, update repeatCount and alteredRootList when a newly created
    partition is inserted into the partition table */
    Let the partition being inserted be ne, rooted at module instance a.
    Look up any equivalent entry oe rooted at b in partitionTable
    If (found oe)
        if (ne.rootIsAltered == false)
            if (oe.rootIsAltered == true)
                /* then update oe's entry to become ne's entry, with
                   oe.rootpath added to the alteredRootList */
                add oe.rootpath into oe.alteredRootList
                append ne.alteredRootList to oe.alteredRootList
                /* ne.alteredRootList may be empty */
            /* set certain field of oe to be equal to ne's as follows: */
                oe.rootpath = ne.rootPath (copy pointer for example)
                oe.repeatCount = ne.repeatCount
                oe.rootIsShared = ne.rootIsShared
                oe.rootIsAltered = false
                /* leave other fields of oe alone, including
                   the key, info (id, result), round, and covMark
                   free ne */
            else
                oe.repeatCount += ne.repeatCount
                assert ne.rootIsShared == oe.rootIsShared
                append ne.altPartRooList to oe.alteredRootList
                free ne (ne is not inserted into table).
        else /* (ne.rootIsAltered is true) */
            add ne.rootpath into oe.alteredRootList.
            append ne.altPartRooList to oe.alteredRootList
            free ne
    else /* lookup failed */
        insert ne into partition table.
```

After the initial Partitioning 406, the shared root and altered root tables are built. After the partition tables are merged after repartitioning 414, the tables are updated. The steps to go through for the building/updating of shared root table and altered root table are almost identical when done after initial round of partitioning or after merging partition tables after a repartitioning round. The only differences are that reset may not be necessary for the initial round. Also, whenever a duplicate entry is found in the shared root table, after the initial round, there is an assert-statement with respect to the repeat count, and after repartitioning, the repeat count may be directly overwritten. An example of pseudo code for building the shared root table is shown as follows.

```
reset sharedRootTable (set marks to CDNS, repeatCount to 1)
foreach (item in partition table that is not marked "repartitioned"
        but with rootIsShared true)
    if (item's root module not in sharedRootTable)
        insert partition root module into sharedRootTable,
            set its local weight;
            set its repeatCount to be item.repeatCount;
            set covMark;
    else
        if (round == 1)
            assert(previous entry repeatCount == item.repeatCount);
        else set its repeatCount = item.repeatCount;
            set covMark according to precedence;
```

An example of pseudo code for building the altered root table is as follows:

```
reset alteredRootTable (set marks to CDNS)
foreach (item in partition table that is not marked "repartitioned")
    if (item.rootIsAltered)
        if (item.rootpath not in alteredRootTable)
            insert item.rootpath into alteredRootTable
            set its local weight;
        set covMark of item.rootpath in table.
        for (all members m of item.alteredRootList)
            if (m not in alteredRootTable)
                insert m into alteredRootTable, set its local weight;
            set covMark of m;
```

Updating coverage marks may be performed each time a partition is subject to verification 408. When module instancing verification results 408, the coverage mark fields of the global partition table, the shared root table, and the altered root table may be updated based on the partition's root module name or module instance name, and the alteredRootList, according to the precedence relationship among various coverage categories.

Once the coverage marks are updated, coverage may be computed. An example of pseudo code for computing coverage is shown below. This method may be performed each time the result of the verification 408 of a partition is returned (i.e., after updating coverage marks).

```
For the entries pe of repartition table that are not marked repartitioned
    if (pe.rootIsAltered)
        let numParts = length of alteredRootList + 1. /*+1 for itself*/
        count numParts * (part Weight-partRootLocalWt) toward coverage
    else
        let numParts = length of alteredRootList
        if (rootIsShared)
            count pe.repeatCount* (partWeight-partRootLocalWt) +
                numParts * (partWeight-partRootLocalWt) toward coverage
        else count pe.repeatCount*partWeight +
                numParts * (partWeight-partRootLocalWt) toward coverage
            /* since members of alteredRootList have their part
               roots in alteredRootTable regardless
               of whether their roots are shared,
               exclude partRootLocalWt from coverage for
               these altered root partitions */
For entries re of sharedRootTable
    count re.repeatCount*localWt toward coverage.
For entries re of alteredRootTable
    count localWt toward coverage.
```

An example of pseudo code for handling coverage during repartitioning 414 is as follows:

```
Let rpe be the partition to be repartitioned
Let curTab be the global partition table
Let newTab be the temporary table that holds new partitions created
during repartitioning
    mark rpe as repartitioned
    make a copy r of rpe, with r.alteredRootList set to empty list.
    assert (r.rootIsAltered == false || r.repeatCount == 1)
    repartition r
    free r
    for each entry in the new partition table
        call processRepartEntry( ) to update curTab and newTab (see below
            for the procedure processRepartEntry( ) )
    for members m of the rpe.alteredRootList
        setup a temporary partition tpe same as rpe but with m as root, and
            with tpe.alteredRootList set to empty,
            tpe.rootIsAltered set to true,
            tpe.rootIsShared set to false,
            and tpe.repeatCount set to 1.
        repartition tpe
        free tpe
        for each entry in the new partition table
            call ProcessRepartEntry( ) to update curTab and newTab
    Merge newTab into the global partition table curTab
    Update sharedRootTable and alteredRootTable.
```

An example of pseudo code of the procedure processRepartEntry( ) for updating the partition tables curTab and newTab during repartition 414 is:

```
/* Let current entry be ne
Let curTab be the global partition table
Let newTab be the temporary table that holds new partitions created
during repartitioning */
integer inCurTab =0, inNewTab = 0;
    set inCurTab = 1 if found equivalent entry oe rooted at b in curTab
    if inCurTab != 1
        set inNewTab = 1 if found equivalent entry oe rooted at b in newTab
    If(inCurTab == 1 || inNewTab == 1) /* oe is set */
        assert (oe result ! = Repartitioned);
        /* the above true as we assume T, R monotonically decreases*/
        if(oe.rootpath == ne.rootpath)
```

(Notice that oe may not be a sub partition of rpe, except for one case: both ne and oe have only one node, rpe.rootpath. Thus in this case, oe is identical to ne, rather than just equivalent. This scenario happens when bin-packed partitions gets repartitioned leading to new partitions containing only the root).

```
        assert(ne.rootpath==rpe.rootpath &&
            both oe and ne have a single node)
        free ne;
        return;
    if (ne.rootIsAltered==false)
        if (oe.rootIsAltered)
```

(The oe's entry is updated to become ne's entry, with oe.rootpath added to the alteredRootList. The oe is not deleted from table because oe may be from curTab, and right now the process is iterating through curTab. Also, deletion may fragment memory. Finally, it is more efficient to have no deletion or insertion of part entry).

```
            add oe.rootpath into oe.alteredRootList
            append ne.altPartRooList to oe.alteredRootList
            /* set certain field of oe to be equal to ne's as follows: */
```

```
                oe.rootpath = ne.rootPath (copy pointer is enough)
                oe.repeatCount = ne.repeatCount
                oe.rootIsShared = ne.rootIsShared
                oe.rootIsAltered = false
                /* leave other fields of oe alone, including
                   the key, info (id, result) round and covMark */
            free ne
        else /* neither of ne and oe is altered */
            oe.repeatCount += ne.repeatCount
            assert ne.rootIsShared == oe.rootIsShared
            append ne.altPartRooList to oe.alteredRootList
            free ne (and of course ne is not inserted into table)
        else /* (ne.rootIsAltered is true) */
            add ne.rootpath into oe.alteredRootList.
            append ne.altPartRooList to oe.alteredRootList
            free ne
else /* lookup failed */
    insert ne into newTab.
```

To address correctness of the above embodiment of the algorithm at a high level, for each round of partitioning/repartitioning, all module instances, and therefore all design variables, are counted correctly in coverage computation. The shared nodes are identified in either the shared root table or in the altered root table. From the algorithm for coverage, shared nodes are not counted from the partition table, and are only counted from the shared root table or the altered root table. Even if shared nodes eventually become not shared due to repartitioning, they stay in the two respective tables and retain their shared label and therefore are not over-counted. Furthermore, the repeat counts of the partitions in the partition table are updated properly. Finally, if a node appears in the shared root table, then it is not altered. Thus its repeat count is consistent with the repeat count of the partitions that share this node.

Figure 5:
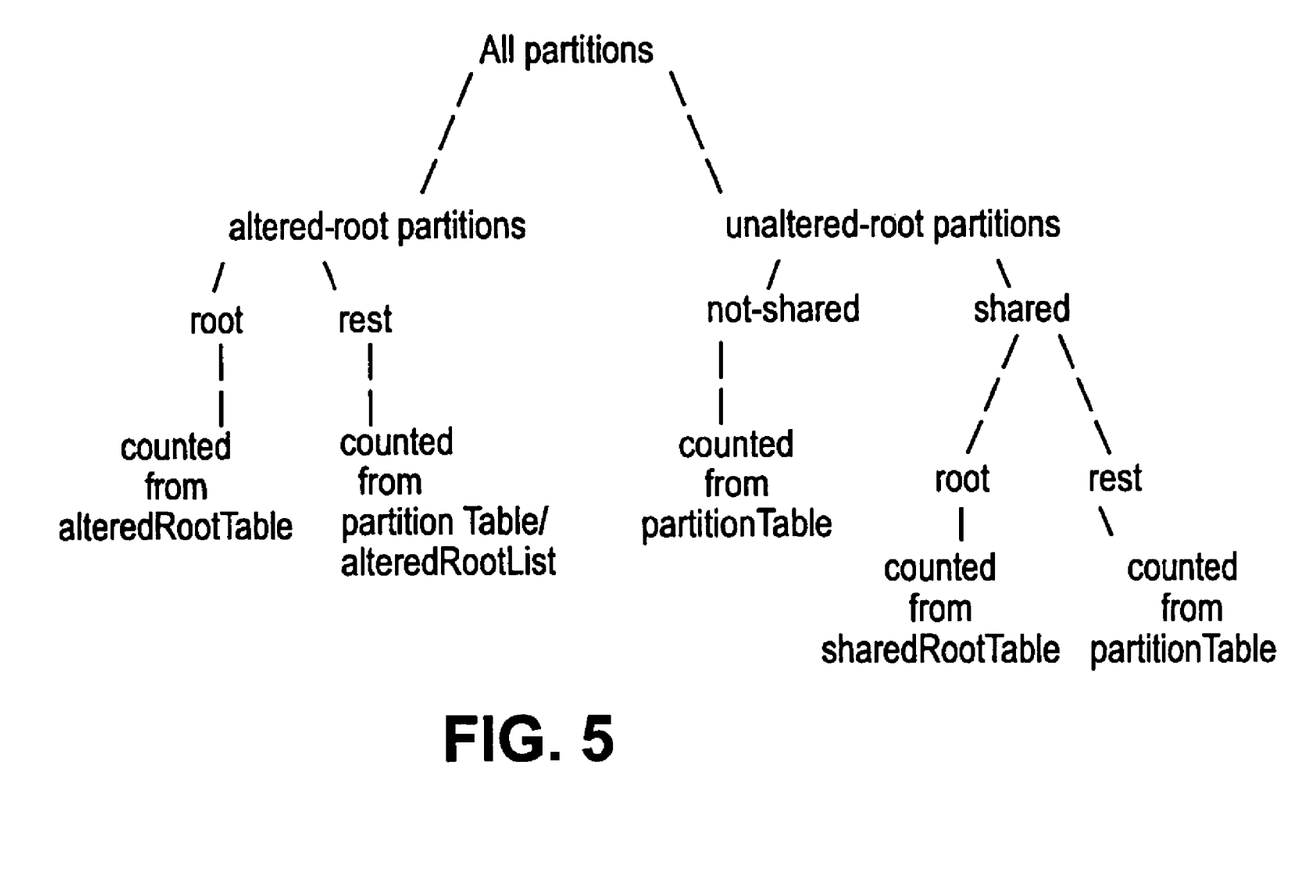
FIG. 5 shows a case analysis of where a state bit can be covered.

Also to assure completeness, all module instances, and hence all design variables, are counted. FIG. 5 shows a case analysis of where a design variable is counted. The cases are complete. ("root" means design variables in the root node of partition; "rest" means design variables in the rest of the partition (outside of the root node)).

In one embodiment, during repartitioning, rather than repartitioning every member of the altered root list, the local partition table resulted from repartitioning rpe can be re-used for each member of the altered root list. Since for each member of the altered root list, its corresponding partition entry may be different from that of rpe, the local partition table may need to be modified during the re-use to cover the different initial values between rpe and copies of rpe for altered roots, such as rootIsAltered, repeatCount, and rootIsShared, for example.

In one embodiment, rather than using a local partition table for partitioning called by repartitioning, the partitions can be directly inserted into the global partition table.

Figure 6:
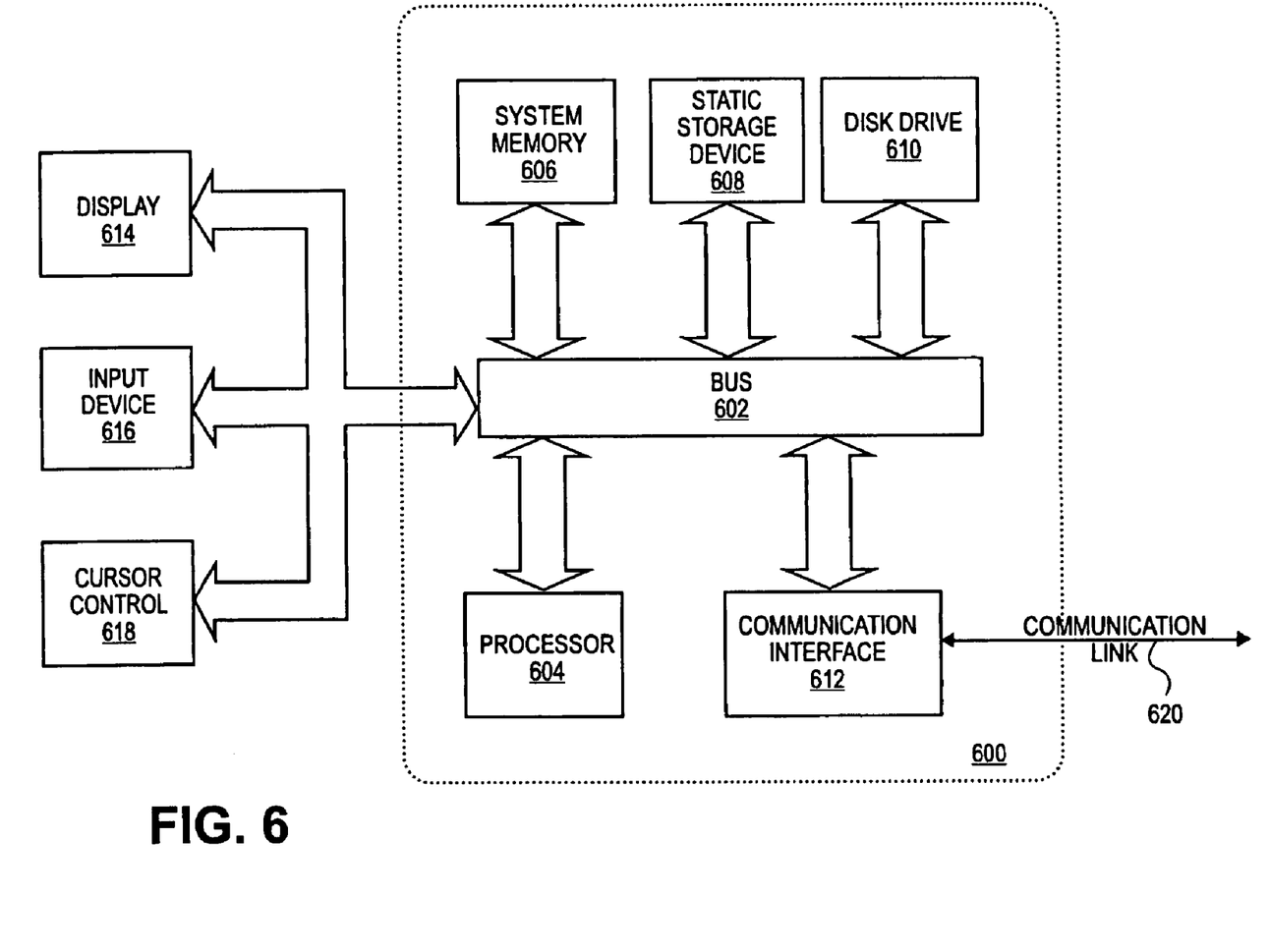
FIG. 6 is a block diagram of a computer system suitable for implementing an embodiment of coverage computation for verification.

FIG. 6 is a block diagram of a computer system 600 suitable for implementing an embodiment of verification based on coverage computation. Computer system 600 includes a bus 602 or other communication mechanism for communicating information, which interconnects subsystems and devices, such as processor 604, system memory 606 (e.g., RAM), static storage device 608 (e.g., ROM), disk drive 610 (e.g., magnetic or optical), communication interface 612 (e.g., modem or ethernet card), display 614 (e.g., CRT or LCD), input device 616 (e.g., keyboard), and cursor control 618 (e.g., mouse or trackball).

According to one embodiment of the invention, computer system 600 performs specific operations by processor 604 executing one or more sequences of one or more instructions contained in system memory 606. Such instructions may be read into system memory 606 from another computer readable medium, such as static storage device 608 or disk drive 610. In alternative embodiments, hard-wired circuitry may be used in place of or in combination with software instructions to implement the invention.

The term "computer readable medium" as used herein refers to any medium that participates in providing instructions to processor 604 for execution. Such a medium may take many forms, including but not limited to, non-volatile media, volatile media, and transmission media. Non-volatile media includes, for example, optical or magnetic disks, such as disk drive 610. Volatile media includes dynamic memory, such as system memory 606. Transmission media includes coaxial cables, copper wire, and fiber optics, including wires that comprise bus 602. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 600. According to other embodiments of the invention, two or more computer systems 600 coupled by communication link 620 (e.g., LAN, PTSN, or wireless network) may perform the sequence of instructions to practice the invention in coordination with one another. Computer system 600 may transmit and receive messages, data, and instructions, including program, i.e., application code, through communication link 620 and communication interface 612. Received program code may be executed by processor 604 as it is received, and/or stored in disk drive 610, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. Additionally, although presently capacity is not an issue for simulation of designs, it is foreseeable that in the future circuit designs may be of a size that cannot be handled by a simulator as a whole. Thus, the method and system for verifying integrated circuit designs through partitioning and coverage computation disclosed herein may be applicable to simulation. The specification and drawings are, accordingly, to be regarded in an illustrative rather than restrictive sense.

What is claimed is:

1. A method of computing coverage for an electronic circuit design, comprising:
   performing property verification for design elements of the electronic circuit design;
   selecting a verification outcome for each design element from a plurality of outcome categories; and
   computing coverage information for each design element based on the verification outcome, wherein computing coverage information includes determining a coverage metric for each outcome category including at least one of "covered", "blocked", "did not finish" (DNF), and "did not start" (DNS).

2. The method of claim 1, wherein "covered" refers to a verified design element.

3. The method of claim 1, wherein "blocked" refers to a design element having an error.

4. The method of claim 1, wherein computing coverage information comprises:
freeing instances of designated design elements from verification.

5. The method of claim 4, further comprising:
re-verifying partitions containing elements reported as blocked, DNF, or DNS during verification.

6. The method of claim 1, wherein computing coverage information comprises:
repartitioning one or more partitions during verification into new partitions;
verifying the new partitions and computing the coverage of the design elements based on the verification outcome of the new partitions.

7. A method of computing coverage for an electronic circuit design, comprising:
performing property verification for design elements of the electronic circuit design;
selecting a verification outcome for each design element from a plurality of outcome categories; and
computing coverage information for each design element based on the verification outcome,
wherein computing coverage information comprises:
identifying an overlap among partitions; and
counting each design element in the overlap once during the verification of the partitions.

8. The method of claim 7, wherein computing coverage information comprises:
freeing instances of designated design elements from verification.

9. The method of claim 7, wherein computing coverage information comprises:
repartitioning one or more partitions during verification into new partitions;
verifying the new partitions and computing the coverage of the design elements based on the verification outcome of the new partitions.

10. The method of claim 9, further comprising:
re-verifying partitions containing elements reported as blocked, DNF, or DNS during verification.

11. A method of computing coverage for an electronic circuit design, comprising:
performing property verification for design elements of the electronic circuit design;
selecting a verification outcome for each design element from a plurality of outcome categories; and
computing coverage information for each design element based on the verification outcome,
wherein computing coverage information comprises:
uniquifying isomorphic partitions so that only one of the isomorphic partitions is subject to verification in order to avoid redundant verification work.

12. The method of claim 11, wherein computing coverage information comprises:
freeing instances of designated design elements from verification.

13. The method of claim 11, wherein computing coverage information comprises:
repartitioning one or more partitions during verification into new partitions;
verifying the new partitions and computing the coverage of the design elements based on the verification outcome of the new partitions.

14. The method of claim 13, further comprising:
re-verifying partitions containing elements reported as blocked, DNF, or DNS during verification.

15. An apparatus for computing coverage for an electronic circuit design, comprising:
means for performing property verification for design elements of the electronic circuit design;
means for selecting a verification outcome for each design element from a plurality of outcome categories; and
means for computing coverage information for each design element based on the verification outcome,
wherein said means for computing coverage information includes means for determining a coverage metric for each outcome category including at least one of "covered", "blocked", "did not finish" (DNF), and "did not start" (DNS).

16. The apparatus of claim 15, wherein "covered" refers to a verified design element.

17. The apparatus of claim 15, wherein "blocked" refers to a design element having an error.

18. The method of claim 15, wherein said means for computing coverage information comprises:
freeing instances of designated design elements from verification.

19. The method of claim 15, wherein said means for computing coverage information comprises:
means for repartitioning one or more partitions during verification into new partitions;
means for verifying the new partitions and computing the coverage of the design elements based on the verification outcome of the new partitions.

20. The apparatus of claim 18, further comprising:
means for re-verifying partitions containing elements reported as blocked, DNF, or DNS during verification.

21. An apparatus for computing coverage for an electronic circuit design, comprising:
means for performing property verification for design elements of the electronic circuit design;
means for selecting a verification outcome for each design element from a plurality of outcome categories; and
means for computing coverage information for each design element based on the verification outcome,
wherein said means for computing coverage information comprises:
means for identifying an overlap among partitions; and
means for counting each design element in the overlap once during the verification of the partitions.

22. The method of claim 21, wherein said means for computing coverage information comprises:
freeing instances of designated design elements from verification.

23. The method of claim 21, wherein said means for computing coverage information comprises:
means for repartitioning one or more partitions during verification into new partitions;
means for verifying the new partitions and computing the coverage of the design elements based on the verification outcome of the new partitions.

24. The apparatus of claim 23, further comprising:
means for re-verifying partitions containing elements reported as blocked, DNF, or DNS during verification.

25. An apparatus for computing coverage for an electronic circuit design, comprising:
- means for performing property verification for design elements of the electronic circuit design;
- means for selecting a verification outcome for each design element from a plurality of outcome categories; and
- means for computing coverage information for each design element based on the verification outcome,
- wherein said means for computing coverage information comprises:
  - means for uniquifying isomorphic partitions so that only one of the isomorphic partitions is subject to verification in order to avoid redundant verification work.

26. The method of claim 25, wherein said means for computing coverage information comprises:
- freeing instances of designated design elements from verification.

27. The method of claim 25, wherein said means for computing coverage information comprises:
- means for repartitioning one or more partitions during verification into new partitions;
- means for verifying the new partitions and computing the coverage of the design elements based on the verification outcome of the new partitions.

28. The apparatus of claim 27, further comprising:
- means for re-verifying partitions containing elements reported as blocked, DNF, or DNS during verification.

29. A tangible computer readable medium comprising a computer program stored in a storage medium or a memory which, when executed by a processing system, causes the system to perform a method of computing coverage for an electronic circuit design, the method comprising:
- performing property verification for design elements of the electronic circuit design;
- selecting a verification outcome for each design element from a plurality of outcome categories; and
- computing coverage information for each design element based on the verification outcome,
- wherein computing coverage information includes determining a coverage metric for each outcome category including at least one of "covered", "blocked", "did not finish" (DNF), and "did not start" (DNS), and
- wherein property verification is performed again after computing the coverage information if the verification outcome is determined insufficient.

30. The medium of claim 29, wherein "covered" refers to a verified design element.

31. The medium of claim 29, wherein "blocked" refers to a design element having an error.

32. The method of claim 29, wherein computing coverage information comprises:
- freeing instances of designated design elements from verification.

33. The medium of claim 32, the method further comprising:
- re-verifying partitions containing elements reported as blocked, DNF, or DNS during verification.

34. The method of claim 29, wherein computing coverage information comprises:
- repartitioning one or more partitions during verification into new partitions;
- verifying the new partitions and computing the coverage of the design elements based on the verification outcome of the new partitions.

35. A tangible computer readable medium comprising a computer program stored in a storage medium or a memory which, when executed by a processing system, causes the system to perform a method of computing coverage for an electronic circuit design, the method comprising:
- performing property verification for design elements of the electronic circuit design;
- selecting a verification outcome for each design element from a plurality of outcome categories; and
- computing coverage information for each design element based on the verification outcome,
- wherein computing coverage information comprises:
  - identifying an overlap among partitions; and
  - counting each design element in the overlap once during the verification of the partitions, and
- wherein property verification is performed again after computing the coverage information if the verification outcome is determined insufficient.

36. The method of claim 35, wherein computing coverage information comprises:
- freeing instances of designated design elements from verification.

37. The method of claim 35, wherein computing coverage information comprises:
- repartitioning one or more partitions during verification into new partitions;
- verifying the new partitions and computing the coverage of the design elements based on the verification outcome of the new partitions.

38. The medium of claim 37, the method further comprising:
- re-verifying partitions containing elements reported as blocked, DNF, or DNS during verification.

39. A tangible computer readable medium comprising a computer program stored in a storage medium or a memory which, when executed by a processing system, causes the system to perform a method of computing coverage for an electronic circuit design, the method comprising:
- performing property verification for design elements of the electronic circuit design;
- selecting a verification outcome for each design element from a plurality of outcome categories; and
- computing coverage information for each design element based on the verification outcome,
- wherein computing coverage information comprises:
  - uniquifying isomorphic partitions so that only one of the isomorphic partitions is subject to verification in order to avoid redundant verification work, and
- wherein property verification is performed again after computing the coverage information if the verification outcome is determined insufficient.

40. The method of claim 39, wherein computing coverage information comprises:
- freeing instances of designated design elements from verification.

41. The method of claim 39, wherein computing coverage information comprises:
- repartitioning one or more partitions during verification into new partitions;
- verifying the new partitions and computing the coverage of the design elements based on the verification outcome of the new partitions.

42. The medium of claim 41, the method further comprising:
- re-verifying partitions containing elements reported as blocked, DNF, or DNS during verification.

* * * * *